United States Patent [19]

Golledge et al.

[11] Patent Number: 5,224,020

[45] Date of Patent: Jun. 29, 1993

[54] ELECTRONIC APPARATUS HAVING MODULAR FRONT AND BACK FUNCTIONAL UNITS AND ELECTRICAL DISTRIBUTION UNIT INCLUDING A FAN THEREBETWEEN

[75] Inventors: Ian Golledge; David J. Gray, both of Romsey; Richard O'Regan, Botley; Frank E. Castle, Winchester, all of England

[73] Assignee: International Business Machines Corporation, Armonk, N.Y.

[21] Appl. No.: 947,076

[22] Filed: Sep. 17, 1992

Related U.S. Application Data

[63] Continuation of Ser. No. 681,012, Apr. 5, 1991, abandoned.

[30] Foreign Application Priority Data

Apr. 18, 1990 [EP] European Pat. Off. ........ 90304142.4

[51] Int. Cl.$^5$ .......................... H05K 7/10; H05K 7/20; H05K 7/14; H05K 7/18
[52] U.S. Cl. .................................... 361/393; 361/384; 361/391; 361/429
[58] Field of Search .................... 364/708; 439/61, 67, 439/77; 361/384, 390–395, 399, 413, 415, 429

[56] References Cited

U.S. PATENT DOCUMENTS

| | | | |
|---|---|---|---|
| 4,038,696 | 7/1977 | Etchison, Jr. et al. | 361/415 |
| 4,084,250 | 4/1978 | Albertine et al. | 364/708 |
| 4,227,238 | 10/1980 | Saito | 361/415 |
| 4,648,007 | 3/1987 | Garner | 361/384 |
| 4,680,674 | 7/1987 | Moore | 361/395 |
| 4,702,154 | 10/1987 | Dodson | 361/384 X |
| 4,748,540 | 5/1988 | Henneberg et al. | 361/415 X |
| 4,922,125 | 5/1990 | Casanova et al. | 361/415 X |
| 5,006,959 | 4/1991 | Freige et al. | 361/384 |
| 5,010,426 | 4/1991 | Krenz | 364/708 X |

FOREIGN PATENT DOCUMENTS

| | | |
|---|---|---|
| 0269479 | 1/1988 | European Pat. Off. |
| 0300717 | 1/1989 | European Pat. Off. |
| 0320107 | 6/1989 | European Pat. Off. |
| 0328260 | 8/1989 | European Pat. Off. |
| 0333618 | 9/1989 | European Pat. Off. |

OTHER PUBLICATIONS

IBM Technical Disclosure Bulletin, vol. 16, No. 6, Nov. 1973 pp. 1733 & 1734 "High-Power/High-Density Modular System and Package" J. B. Gillett.

Primary Examiner—Lincoln Donovan
Assistant Examiner—Michael W. Phillips
Attorney, Agent, or Firm—Roy W. Truelson

[57] ABSTRACT

Modular electrical apparatus is provided which comprises a plurality of customer removable electrical devices 22 inserted in one end of a drawer type tubular chassis 10 and various field replaceable support units 44,46 mounted at the other end of the chassis. The devices and support units are all blind pluggable into a removable central electrical distribution unit which includes complementary connectors 52,54,56 on opposite sides and a set of electrical conductors for connecting the devices and units. Internal electrical connection of all the units in the drawer is via the electrical distribution unit and external electrical connection is made only to the outer end of the support units. Cooling fans for inducing an air flow through the tubular chassis to cool the devices and support units are mounted in the central electrical distribution unit. All the components can be removed for repair or replacement from either the front or rear entrance of the tubular chassis.

13 Claims, 5 Drawing Sheets

5,224,020

ELECTRONIC APPARATUS HAVING MODULAR FRONT AND BACK FUNCTIONAL UNITS AND ELECTRICAL DISTRIBUTION UNIT INCLUDING A FAN THEREBETWEEN

This application is a continuation of Ser. No. 07/681,012 filed Apr. 5, 1991, now abandoned.

FIELD OF THE INVENTION

This invention relates to the field of modular electrical apparatus and more specifically to the packaging and electrical interconnection of removable electrical units in a chassis.

BACKGROUND OF THE INVENTION

A current trend in the design of electrical systems is the provision of modular configurations whereby individual electrical units are readily accessible and in some cases customer removable. The use of modular designs provides a number of different advantages. Manufacture and assembly is made simpler in that each unit can be manufactured and tested separately before assembling in the complete system. Furthermore, if a removable device becomes defective, it can be removed for repair and replaced with a working device and the system can continue in operation with a minimum of downtime. A typical multi-component system of this type is a computing system whereby data storage devices, processing hardware, power supplies, cooling fans etc are all contained in a single unit.

In such modularized systems, it is a common requirement that the different devices be interconnected with one another, and also connected to various signal and power supply lines. In a modular system with a number of separate units this can lead to a large number of signal and power cables which take up a lot of space and can make fault diagnosis difficult. A number of different electrical distribution systems have been described in the art.

EP-A-320 107 describes a conventionally packaged drawer containing a plurality of front loaded disk drives which are blind pluggable in a central bulkhead. A conventional cabling arrangement is provided for the interconnection of the disk drives and other support units in the drawer.

EP-A-328 260 describes a similar system configuration wherein data storage devices contained in individual canisters are blind pluggable into a central bulkhead. Power/control circuitry is contained in a unit located in a rear compartment behind the central bulkhead. The unit is connected to the storage devices by means of a connector located in the bulkhead. Manual connection of the power supply unit to the bulkhead connection is required.

EP-A-0 300 717 describes a interconnecting system wherein removable disk drives are blind pluggable into electrical connectors in a backplane circuit board. Other units are blind pluggable into the rear of the circuit board. Input/output signals are routed through a cable which connects directly to signal traces on the circuit board.

An article entitled "High-Power/High-Density Modular System and Package" by J B Gillett (IBM Technical Disclosure Bulletin, Volume 16, Number 6, Nov. 1973, pages 1733 and 1734) describes a modular system wherein different units are pluggable into a central electrical distribution channel. There is no description of the routing of external electrical signals within the system.

EP-A-0 333 618 (U.S. Pat. No. 4,922,125) describes a data processing system packaged in a enclosure comprising a chassis and cable carrier which are manufactured separately and subsequently merged, the cable carrier being inserted into the chassis via an opening in the chassis top surface. Data storage devices slide into the front aperture in the chassis and electrical connection is made with the cable carrier via blind connectors. A logic cage slides into the rear of the chassis and manual intervention is required to connect the logic cage with the cable carrier.

SUMMARY OF THE INVENTION

Thus prior art systems have described a variety of modular systems showing different packaging arrangements and electrical interconnection between electrical devices. However, there is an ongoing requirement for modular systems in which the electrical devices are easily assembled in the system with the minimum of manual intervention in the electrical connection of the devices and wherein the devices are readily accessible for repair and/or replacement.

Accordingly, the present invention provides modular electrical apparatus comprising a first group of replaceable functional units each having an auto-plugging connector at one end thereof, a second group of one or more replaceable functional units each having an auto-plugging connector at one end thereof and a further electrical connector at the opposite end thereof for enabling external electrical connection to the apparatus, a support structure for supporting the two groups of functional units, an electrical distribution unit mounted within the support structure, the first and second group of units being mounted on respective sides thereof, the distribution units including complementary connectors mounted at opposite sides thereof for receiving the auto-plugging connectors of respective groups of units and a set of electrical conductors between the complementary connectors for interconnecting the functional units, whereby external information signals to the apparatus are routed via at least one unit of the second group and the electrical distribution unit.

In the modular configuration provided, the first and second group of units merge with the electrical distribution unit to form the apparatus with all electrical connection between the various units being made via self-docking connectors. In this configuration, there is no tangle of power and signal cables which have to be interconnected by hand. This permits a simple assembly procedure with a consequent reduction in assembly time and cost and also a reduction in the likelihood of bad connections. Furthermore, using the configuration described, electrical interconnection of all the devices is via the electrical distribution unit, and external signals are routed through the rear connectors on the second group of units. The external signal cabling to these connectors is easily removed prior to the removal of a unit of the second group from the apparatus.

It is preferred that the electrical distribution unit is a replaceable unit mounted within a central compartment of the support structure. This allows the separate manufacture and assembly and testing of the electrical distribution unit and furthermore, the electrical distribution unit can subsequently be easily removed from the support structure for fault diagnosis or replacement. Thus all the major components of the modular electrical apparatus are removable from the support structure and thus replacement of any defective component is easily carried out.

It is further preferred that the support structure comprises chassis in the form of a rectangular tube having front and rear openings. The tubular structure provides good rigidity and efficient RFI screening of the devices contained therein. Although a further aperture could be provided in the chassis, it is preferred that chassis is adapted to receive the electrical distribution unit in the chassis via either the front or rear openings.

It is further preferred that the first group of units is mounted in a front compartment of the chassis via the front chassis opening and the second group of units is mounted in a rear compartment of the chassis, both the second group of units and the electrical distribution unit being mounted in the chassis via the rear chassis opening. Thus for apparatus in the form of a rack mounted drawer, all the components are accessible and removable from the drawer without the need to remove the drawer from the rack.

In a preferred apparatus, the complementary connectors and electrical conductors are formed into a cable assembly which is removably mounted within a cable support frame. The complementary connectors are held in slots in the frame in the correct position for the connection of the self-docking connectors on the individual units of both the first and second group.

Preferably the first group of units comprises a plurality of data storage devices e.g. disk drives, mountable in a front compartment of the support structure and accessible from the front. The second group of units preferably comprises a power supply unit and controller unit mounted in a rear compartment, both being accessible from the rear of the structure.

The invention will now be described by way of example only with reference to the accompanying drawings.

DETAILED DESCRIPTION OF THE PREFERRED EMBODIMENT

Figure 1:
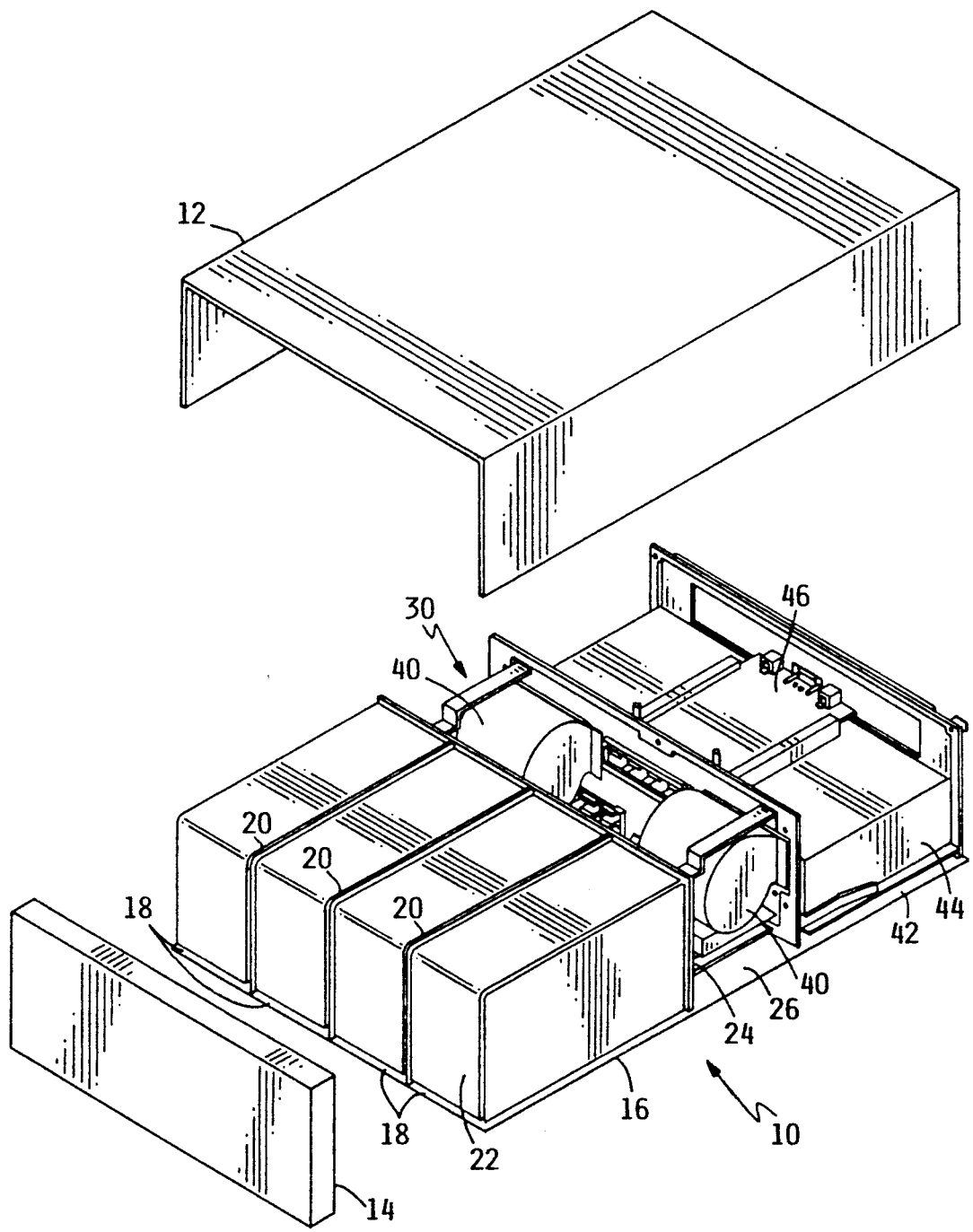
FIG. 1 is a front perspective view of a modular electrical apparatus according to the present invention (the top and side portions of the chassis and the apparatus front cover are shown exploded from the remainder of the apparatus for clarity)
Figure 2:
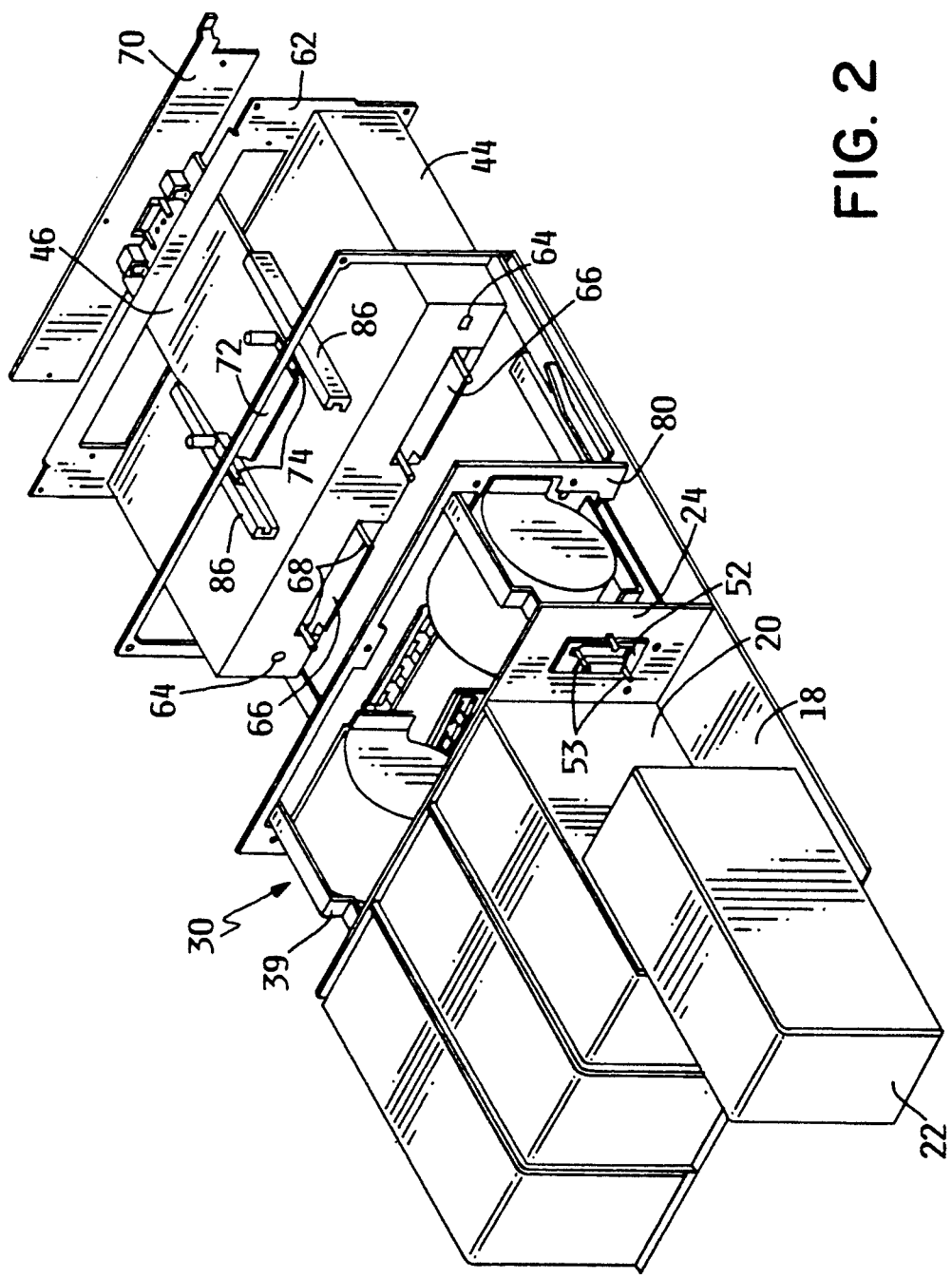
FIG. 2 is a partially exploded front perspective view of the electrical apparatus shown in FIG. 1.
Figure 3:
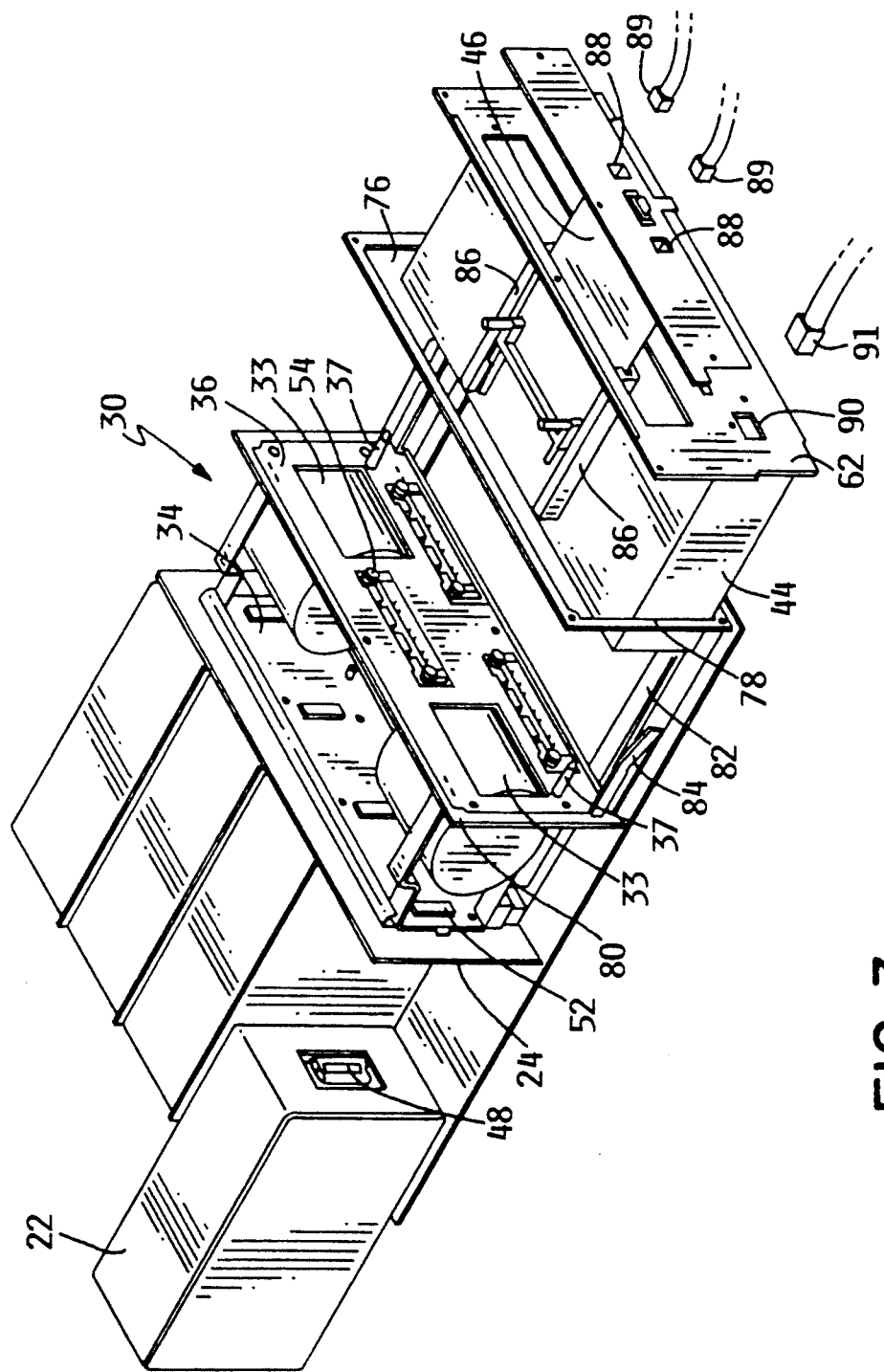
FIG. 3 is a partially exploded rear perspective view of the electrical apparatus shown in FIG. 1.

FIGS. 1 to 3 show one embodiment of the modular electrical apparatus in the form of a drawer 10 suitable for mounting in a rack containing a number of drawers. The drawer consists of groups of individual removable electrical devices which are mounted within a tubular chassis, the top and side portion 12 of which is shown in exploded view in FIG. 1 but omitted from FIGS. 2 and 3 for clarity. Also seen in FIG. 1 is the apparatus front cover 14. The tubular chassis takes the form of a unitary structure, the component parts of which are permanently welded together to give a chassis with only front and rear openings and no removable lid. As is shown in FIG. 1, the chassis is divided into three compartments which contain the main components of the system. The front compartment 16 is divided into four bays 18 defined by the chassis walls and three partitions 20, each bay containing a removable data storage device e.g. disk drive 22. The chassis has high structural rigidity and provides good support for the disk drives without undue vibration.

Furthermore, in conjunction with the front and rear covers this type of chassis provides efficient RFI screening of the devices. A dividing wall 24 separates the front compartment from the central compartment 26 which houses an electrical distribution unit 30 and a pair of centrifugal cooling fans 40 which provide forced air cooling of the drawer. Behind the central compartment, the rear compartment 42 houses a power supply unit 44 and controller card 46. Each of the main components and the packaging and electrical interconnection of the individual devices is described in more detail below.

The disk drives are removably mounted in the bays defined within the front compartment. At the rear of each disk drive (seen in FIG. 3) is a self-docking power and signal connector 48 which locates on and mates with a corresponding floating device connector 52 mounted in the dividing wall. In an equivalent design, connector 48 floats and connector 52 is fixed.

Figure 4:
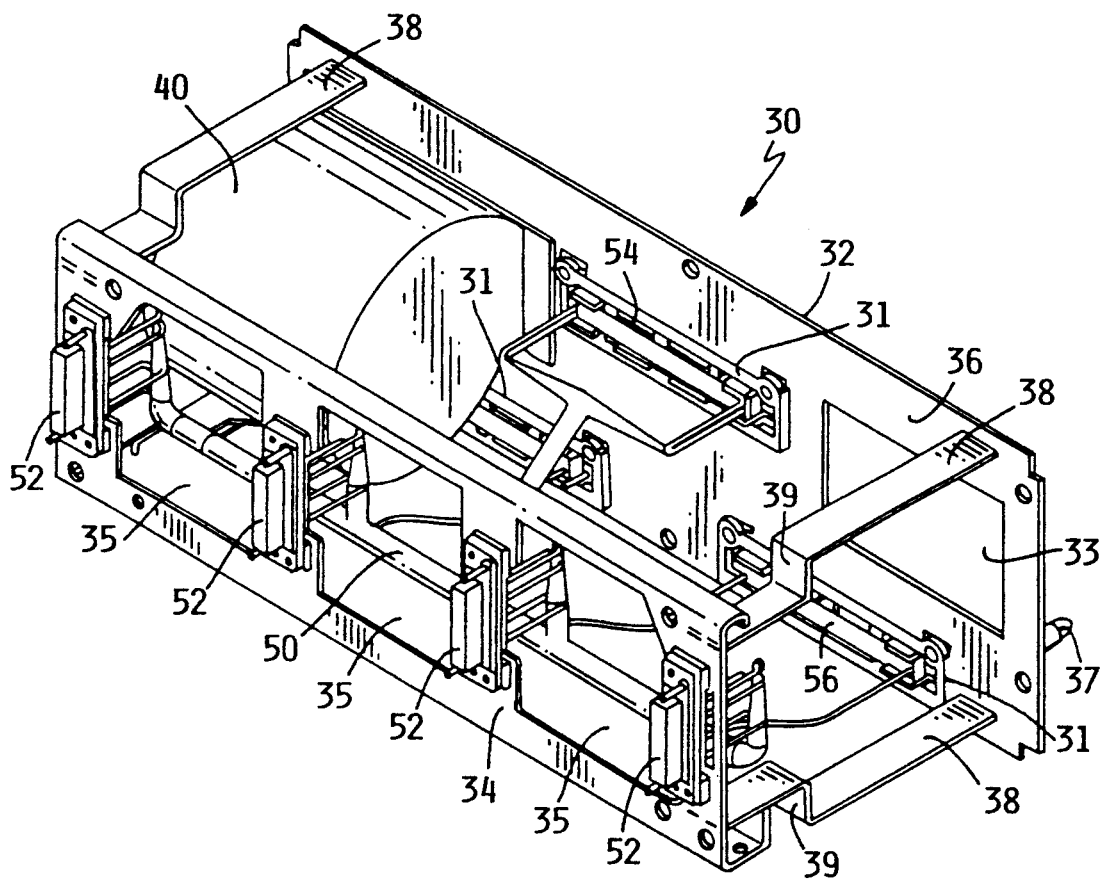
FIG. 4 is a front perspective view of the electrical distribution unit as employed in the electrical apparatus shown in FIG. 1.

The electrical distribution unit 30 is located within the central compartment and is shown in detail in FIG. 4. The unit comprises a cable support frame 32 within which is mounted a cable assembly 50 and the two cooling fans. The support frame comprises front 34 and rear 36 parallel panels which are connected together at each corner by means of four metal straps 38. The front panel is smaller than the rear panel and includes three forward openings 35 defined by four struts. The cooling fans are mounted on the rear panel with the exit aperture of each fan being aligned with one of a pair of rectangular apertures 33 located in the rear panel. The rear panel also includes three rectangular slots 31 (shown in FIG. 4 with connectors in position) which are configured with one slot located between the two fan apertures and the other two slots disposed below and symmetrically about the upper slot. Also included on the back surface of the rear panel are two pins 37 (seen to better effect in FIGS. 3 and 4) which are used for guidance purposes during assembly of the drawer.

Figure 5:
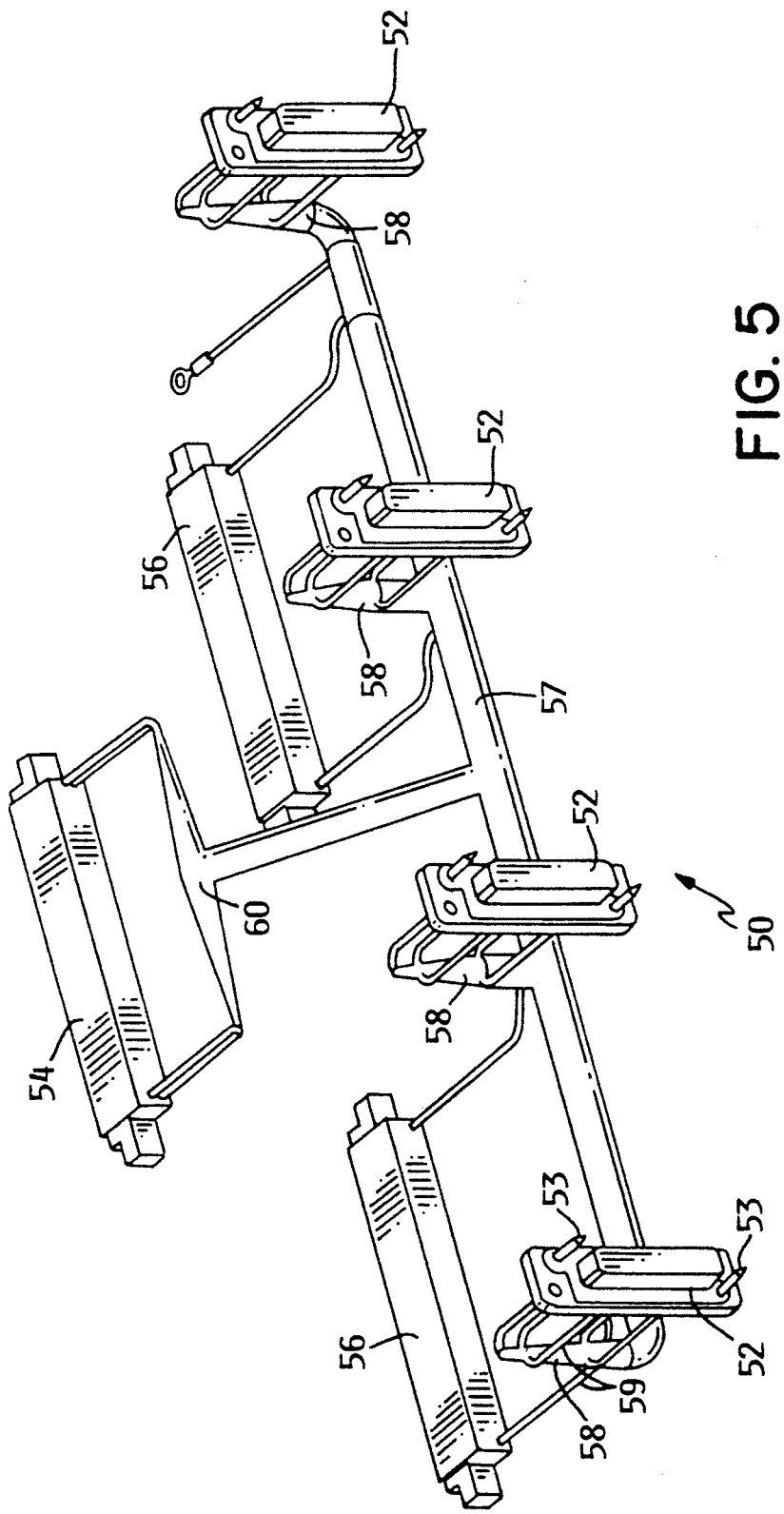
FIG. 5 is a rear perspective view of the cable assembly empoloyed in the electrical distribution unit shown in FIG. 4.

The cable assembly 50 shown in FIG. 5 takes the form of a harness to which is attached four forward facing device connectors 52, one backward facing controller connector 54 and two backward facing power supply connectors 56. The cable loom comprises a cylindrically shaped bundle of wires 57 extending upwards from which are four equally spaced extensions 58. Extending from each extension by means of forward extending conductors 59 is a device connector. Extending rearwards and inclined at an angle to the cylindrical bundle is a T-shaped arm 60 the ends of which is attached the controller connector. Below this are the two power supply connectors also connected by electrical conductors to the main bundle.

The assembled electrical distribution unit is shown in FIG. 4. The cable assembly is held in place within the support frame by inserting each of the cable assembly connectors into apertures in the frame. The three rearward extending connectors are mounted in the three slots in the rear panel of the frame and each of the four device connectors are mounted in slots in the front vertical struts. Each of the frame apertures is slightly larger than the corresponding connector and the connectors are fixed in place while still being able to float within the apertures.

The power supply 44 is located in and takes up the lower part of the rear compartment (FIG. 3). A plate 62 attached to the rear of the power supply extends above the power supply and forms part of the rear cover of the assembled drawer. The front face of the power supply includes two orifices 64 in positions corresponding to the position of the two pins 37 located on the cable support frame rear panel. In between the two orifices are two openings through each of which extends a contact tabbed printed circuit board 66 which mates with connectors 56 using a pair of forward extending guide pins 68.

The controller unit 46 takes the form of a circuit board attached to a plate 70. The sides of the circuit board fit into a pair of guide rails 86 mounted in the appropriate positions on top of the power supply. The front of the circuit board includes a contact tabbed extension 72 which mates with connector 54 using a pair of guide pins 74. The rear plate acts in cooperation with the power supply rear plate to complete the rear of the drawer.

Assembly of the drawer and electrical connection of the individual devices is carried out as follows:

The assembled electrical distribution unit 30 comprising the cable assembly 50 and cooling fans 40 mounted in the cable support frame 32 is offered up to the chassis rear opening 76 (FIG. 3) and passes through the rear picture frame 78 fixed at the rear of the chassis. The front panel 34 of the support frame passes through a central opening defined by the central picture frame 80 with the device connectors 52 passing through the corresponding apertures in the dividing wall 24. The edges of the support frame rear panel engage with the central picture frame and the support frame is fixed into position by means of screws passing through the rear panel and into corresponding holes in the picture frame. The rear panel and associated picture frame 80 thereby form the partition between the central compartment 26 and the rear compartment 42. The support frame is fixed to the dividing wall from the front also by means of screws passing through the dividing wall into holes in the front panel. The vertical portions 39 of the cable support frame straps 38 can flex to compensate for any discrepancy in the sizes of the central compartment 26 and electrical distribution unit to ensure secure fixing of the unit and correctly position all connectors as well as provide an airtight bulkhead between high and low pressure zones.

When the electrical distribution unit is in place, the power supply unit is inserted into the rear chassis opening 76. As can be seen most clearly in FIG. 3, fixed to the floor at each side of the rear compartment is a platform 82 and guide way 84. In conjunction with the rearward extending pins on the support frame rear panel, these assist with the correct positioning of the power supply unit as it is guided into place. As the connectors on the power supply approach the corresponding connectors at the bottom of the rear panel, the two pairs of pins locate in the tapered holes shown in FIG. 2. The rear panel connectors 'float' thereby providing correct alignment of the power and signal tabs of the power supply with the rear panel connectors 56. Electrical connection is completed when the power supply is pushed firmly home. The rear plate of the power supply engages with the rear picture frame of the chassis and is fixed in position at each corner. Power is provided to the power supply unit via cable 91 which fits into socket 90 (FIG. 3).

The controller unit is offered up to the rectangular aperture in the power supply rear plate with the edges of the circuit board locating in corresponding grooves in the two guide rails 86 mounted on the power supply. The circuit board is connected to the corresponding edge connector 54 on the rear panel of the support frame in the same way as the power supply. Data and control signals are input to and output from the drawer via a cable 89 attached to the connector 88 at the rear of the controller (FIG. 3).

Each disk drive enters the drawer via the bay front aperture and slides into its final position within the bay. As the rear of the disk drive approaches the dividing wall, two pins 53 on the floating connector mounted in the dividing wall engage with two tapering holes in the disk drive connector, the floating connector adjusting its position thereby ensuring alignment between the corresponding electrical connectors. Electrical connection is completed when the disk drive is pushed firmly home.

In operation, all external data and control signals enter the drawer via the controller unit. This unit sends out control signals to each of the devices which are routed through the electrical distribution unit. Power to the devices is provided via the electrical distribution unit.

A control panel (not shown) is provided at the front of each device and includes a power switch and a number of indicator lights indicating device status. When the power switch is set on or off, a signal is routed via the electrical distribution unit to the power supply which then supplies or switches off power to that particular device.

If a part of the drawer malfunctions when mounted in a rack, the configuration described allows the service engineer to access any of the components from either the front or rear of the drawer. The power supply, controller unit and electrical distribution unit are all removable from the rear of the drawer and the devices are removable from the front of the drawer. A defective cable assembly, defective fans etc are easily replaced with a minimum of inconvenience to the user. All this can be done without removing the drawer from the rack.

Although the apparatus described above shows floating connectors as part of the cable assembly, it will be apparent that the desired self-docking of the devices would equally well be achieved with static connectors on the two sides of the cable assembly mating with floating connectors on each of the units. Furthermore, while the described embodiment has shown the apparatus in the form of a rack mounted drawer, it will be apparent that the apparatus may equally well be used as an under-desk tower.

What is claimed is:

1. Modular electrical apparatus comprising:
   a first set of replaceable functional units (22) each having an auto-plugging connector (48) at one end thereof, said first set comprising at least two replaceable functional units;
   a second set of one or more replaceable functional units (44,46) each having an auto-plugging connector (66,72) at one end thereof and a further electrical connector (88,90) at the opposite end thereof for enabling external electrical connection to the apparatus;

a support structure (10) supporting the two sets of functional units;

an electrical distribution unit (30) mounted within the support structure, said distribution unit comprising a cable assembly (50), including complementary connectors (52,54,56) and electrical conductors (57,58,59,60), which is removably mounted in a support frame (32), the complementary connectors being located in corresponding apertures in opposing panels (34,36) of the frame, such that the first and second sets of units are mounted on opposite sides thereof, the distribution unit further comprising one or more cooling fans mounted within the distribution unit between said opposing panels for providing forced air cooling for both groups of functional units, said complementary connectors located in said corresponding apertures in said opposing panels of the frame receiving the auto-plugging connectors of respective sets of units mounted on opposite sides thereof and said set of electrical conductors between the complementary connectors interconnecting the functional units whereby external information signals to the apparatus are routed via at least one unit of the second set and the electrical distribution unit.

2. The modular electrical apparatus of claim 1, wherein the first set of functional units consists of a plurality of data storage devices (22), the second set of units comprising a power supply unit and a controller unit (46) whereby external data and control signals are mounted through the controller unit.

3. The modular electrical apparatus of claim 1, wherein the support structure comprises a chassis in the form of a rectangular tube having front and rear openings.

4. The modular electrical apparatus of claim 3, wherein the first set of functional units consists of a plurality of data storage devices (22), the second set of units comprising a power supply unit and a controller unit (46) whereby external data and control signals are routed through the controller unit.

5. The modular electrical apparatus of claim 1, wherein the electrical distribution unit is a replaceable unit mounted within a central compartment (26) in the support structure.

6. The modular electrical apparatus of claim 5, wherein the first set of functional units consists of a plurality of data storage devices (22), the second set of units comprising a power supply unit and a controller unit (46) whereby external data and control signals are routed through the controller unit.

7. The modular electrical apparatus of claim 5, wherein the support structure comprises a chassis in the form of a rectangular tube having front and rear openings.

8. The modular electrical apparatus of claim 7, wherein the chassis is adapted to receive units of the first set in a front compartment (16) of the chassis via the front chassis opening, the second set of units in the rear compartment (42) of the chassis and the electrical electrical distribution unit in a central compartment (26) of the chassis, both via the rear chassis opening.

9. The modular electrical apparatus of claim 8, wherein the first set of functional units consists of a plurality of data storage devices (22), the second set of units comprising a power supply unit and a controller unit (46) whereby external data and control signals are routed through the controller unit.

10. The modular electrical apparatus of claim 1, wherein one panel of said electrical distribution unit contains one or more apertures corresponding to and located at said one or more cooling fans permitting air passage through said cooling fans and apertures, and wherein said panel divides said support structure into front and rear portions and forms a barrier to the passage of cooling air through said support structure other than through said cooling fans and apertures.

11. An apparatus for supporting a plurality of modular functional functional electrical units comprising:

a support structure (10) for supporting a first set and a second set of modular replaceable functional electrical units, said structure being capable of simultaneously supporting at least two units of said first set and at least one unit of said second set, wherein each unit of said first set has an auto-plugging connector at one end thereof wherein each unit of said second set has an auto-plugging connector at one end thereof and a further electrical connector at the opposite end thereof for enabling external electrical connection to the apparatus; and an electrical distribution unit (30) mounted within the support structure and positioning it into a first and second region on opposite sides thereof, said first region being adapted to support units of said first set and said second region being adapted to support units of said second set, said distribution unit comprising a cable assembly (50), including complementary connectors (52,54,56) and electrical conductors (57,58,59,60), which is removably mounted in a support frame (32), the complementary connectors being located in corresponding apertures in opposing panels (34,36) of the frame, said distribution unit further comprising one or more cooling fans mounted within the distribution unit between said opposing panels for provide forced air cooling for both groups of functional units, said complementary connectors mounted at said opposite sides for receiving the auto-plugging connectors of respective sets of units and said set of electrical conductors between the complementary connectors for interconnecting the functional units whereby external information signals to the apparatus are routed via at least one unit of the second set and the electrical distribution unit.

12. The apparatus of claim 11, wherein the support structure comprises a chassis in the form of a rectangular tube having front and rear openings.

13. The apparatus of claim 11, wherein one panel of said electrical distribution unit contains one or more apertures corresponding to and located at said one or more cooling fans permitting air passage through said cooling fans and apertures, and wherein said panel divides said support structure into front and rear portions and forms a barrier to the passage of cooling air through said support structure other than through said cooling fans and apertures.

* * * * *